(12) United States Patent
Otake et al.

(10) Patent No.: US 12,199,173 B2
(45) Date of Patent: Jan. 14, 2025

(54) NITRIDE SEMICONDUCTOR DEVICE

(71) Applicant: ROHM CO., LTD., Kyoto (JP)

(72) Inventors: Hirotaka Otake, Kyoto (JP); Shinya Takado, Kyoto (JP); Taketoshi Tanaka, Kyoto (JP); Norikazu Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 752 days.

(21) Appl. No.: 17/426,217

(22) PCT Filed: Jan. 15, 2020

(86) PCT No.: PCT/JP2020/001101
§ 371 (c)(1),
(2) Date: Jul. 28, 2021

(87) PCT Pub. No.: WO2020/158394
PCT Pub. Date: Aug. 6, 2020

(65) Prior Publication Data
US 2022/0102543 A1 Mar. 31, 2022

(30) Foreign Application Priority Data
Feb. 1, 2019 (JP) ................. 2019-017335

(51) Int. Cl.
*H01L 29/00* (2006.01)
*H01L 29/20* (2006.01)
(Continued)

(52) U.S. Cl.
CPC ...... *H01L 29/7786* (2013.01); *H01L 29/2003* (2013.01); *H01L 29/452* (2013.01); *H01L 29/812* (2013.01)

(58) Field of Classification Search
None
See application file for complete search history.

(56) References Cited

U.S. PATENT DOCUMENTS

| 2011/0227093 A1 | 9/2011 | Hikita et al. |
| 2013/0082276 A1 | 4/2013 | Park et al. |

(Continued)

FOREIGN PATENT DOCUMENTS

| JP | 2010-135641 | 6/2010 |
| JP | 2011-029507 | 2/2011 |

(Continued)

OTHER PUBLICATIONS

Notice of Reasons for Reasons for Refusal issued for Japanese Patent Application No. 2020-569492, Dispatch Date: May 11, 2023, 11 pages including English machine translation.

(Continued)

*Primary Examiner* — Bradley Smith
(74) *Attorney, Agent, or Firm* — XSENSUS LLP

(57) ABSTRACT

A nitride semiconductor device 1 includes a first nitride semiconductor layer 4 that constitutes an electron transit layer, a second nitride semiconductor layer 5 that is formed on the first nitride semiconductor layer, is larger in bandgap than the first nitride semiconductor layer, and constitutes an electron supply layer, and a gate portion 20 that is formed on the second nitride semiconductor layer. The gate portion 20 includes a first semiconductor gate layer 21 of a ridge shape that is disposed on the second nitride semiconductor layer 5 and is constituted of a nitride semiconductor containing an acceptor type impurity, a second semiconductor gate layer 22 that is formed on the first semiconductor gate layer 21 and is constituted of a nitride semiconductor with a larger (Continued)

bandgap than the first semiconductor gate layer 21, and a gate electrode 23 that is formed on the second semiconductor gate layer 22 and is in Schottky junction with the second semiconductor gate layer 22.

16 Claims, 11 Drawing Sheets

(51) Int. Cl.
*H01L 29/45* (2006.01)
*H01L 29/778* (2006.01)
*H01L 29/812* (2006.01)

(56) References Cited

U.S. PATENT DOCUMENTS

| | | | | |
|---|---|---|---|---|
| 2014/0175455 | A1* | 6/2014 | Tanimoto | H01L 29/778 438/197 |
| 2015/0295073 | A1* | 10/2015 | Tomita | H01L 29/7781 257/76 |
| 2016/0056274 | A1 | 2/2016 | Kawaguchi | |
| 2017/0288046 | A1 | 10/2017 | Miyamoto et al. | |
| 2018/0061975 | A1* | 3/2018 | Tanaka | H01L 29/7786 |

FOREIGN PATENT DOCUMENTS

| | | |
|---|---|---|
| JP | 2013-038180 | 2/2013 |
| JP | 2013-080894 | 5/2013 |
| JP | 2014-140024 | 7/2014 |
| JP | 2015-204304 | 11/2015 |
| JP | 2016-046413 | 4/2016 |
| JP | 2017-183482 | 10/2017 |
| JP | 2018-157177 | 10/2018 |

OTHER PUBLICATIONS

International Preliminary Report on Patentability issued for International Patent Application No. PCT/JP2020/001101, Date of mailing: Aug. 12, 2021, 21 pages including English translation.
International Search Report and Written Opinion issued for International Patent Application No. PCT/JP2020/001101, Date of mailing: Apr. 14, 2020, 12 pages including English translation of Search Report.

* cited by examiner

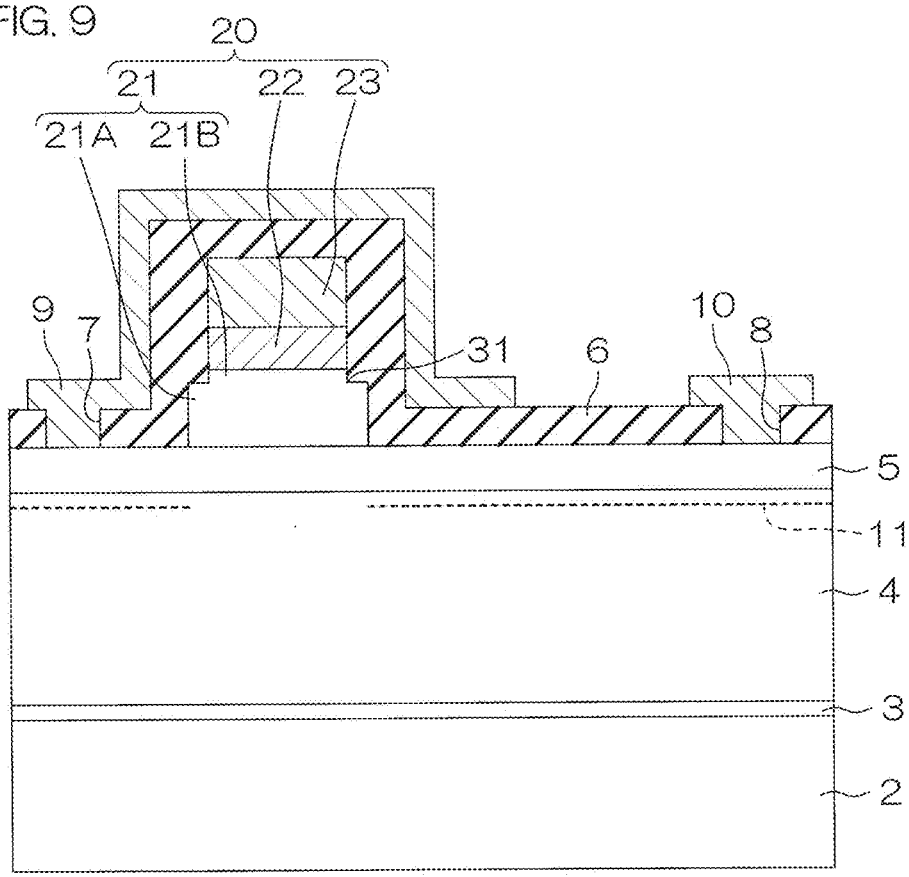

NITRIDE SEMICONDUCTOR DEVICE

TECHNICAL FIELD

The present invention relates to a nitride semiconductor device that is constituted of a group III nitride semiconductor (hereinafter referred to at times simply as "nitride semiconductor").

BACKGROUND ART

A group III nitride semiconductor a semiconductor among group III-V semiconductors with which nitrogen is used as the group V element. Aluminum nitride (AlN), gallium nitride (GaN), and indium nitride (InN) are representative examples thereof. It can generally be expressed as $Al_xIn_yGa_{1-x-y}N$ ($0 \leq x \leq 1$, $0 \leq y \leq 1$, $0 \leq x+y \leq 1$).

An HEMT (high electron mobility transistor) using such a nitride semiconductor has been proposed. Such an HEMT includes, for example, an electron transit layer constituted of GaN and an electron supply layer constituted of an AlGaN epitaxially grown on the electron transit layer. A pair of source electrode and drain electrode are formed such as to contact the electron supply layer and a gate electrode is disposed therebetween.

Due to polarization caused by lattice mismatch of GaN and the AlGaN, a two-dimensional electron gas is formed at a position inside the electron transit layer that is only a few Å inward from an interface between the electron transit layer and the electron supply layer. A source and a drain are connected to each other with the two-dimensional electron gas as a channel. When the two-dimensional electron gas is interrupted by application of a control voltage to the gate electrode, the source and the drain are interrupted from each other. The source and the drain are made conductive to each other in a state where the control voltage is not applied to the gate electrode and therefore the device is of a normally-on type.

Devices using a nitride semiconductor have features of high withstand voltage, high temperature operation, high current density, high speed switching, and low on resistance and are thus being examined for application to power devices.

However, for use as a power device, a device must be of a normally-off type that interrupts current at zero bias and therefore, an HENT such as described above cannot be applied to a power device.

A structure for realizing a nitride semiconductor HEMT of the normally-off type has been proposed, for example, in Patent Literature 1.

CITATION LIST

Patent Literature

Patent Literature 1: Japanese Patent Application Publication No. 2011-29507

SUMMARY OF INVENTION

Technical Problem

Patent Literature 1 discloses an arrangement where a p type GaN gate layer and an n type AlGaN layer are successively laminated on an AlGaN electron supply layer, a gate electrode is disposed thereon, and a channel is eliminated by a depletion layer spreading from the p type GaN gate layer to achieve a normally-off operation. In Patent Literature 1, as the gate electrode, a gate electrode constituted of TiAl that is in ohmic junction with the n type AlGaN layer is used.

With such an arrangement, there is still a problem that a gate leak current is large because the gate electrode and the n type AlGaN layer are in ohmic junction.

If the gate leak current is large, this leads to such problems as not being able to secure a gate voltage necessary for obtaining a desired on resistance or power consumption by a gate drive circuit increasing, and there is concern about decrease in efficiency and increase in heat generation in a power circuit and a control circuit portion. This is a large issue for an HEMT that features high frequency switching.

An object of the present invention is to provide a nitride semiconductor device with which a gate leak current can be reduced sufficiently.

Solution to Problem

A nitride semiconductor device according to a preferred embodiment of the present invention includes a first nitride semiconductor layer that constitutes an electron transit layer, a second nitride semiconductor layer that is formed on the first nitride semiconductor layer, is larger in bandgap than the first nitride semiconductor layer, and constitutes an electron supply layer, and a gate portion that is formed on the second nitride semiconductor layer, and the gate portion includes a first semiconductor gate layer of a ridge shape that is disposed on the second nitride semiconductor layer and is constituted of a nitride semiconductor containing an acceptor type impurity, a second semiconductor gate layer that is formed on the first semiconductor gate layer and is constituted of a nitride semiconductor with a larger bandgap than the first semiconductor gate layer, and a gate electrode that is formed on the second semiconductor gate layer and is in Schottky junction with the second semiconductor gate layer.

The preferred embodiment of the present invention includes a source electrode and a drain electrode that are disposed on the second nitride semiconductor layer and the source electrode and the drain electrode are respectively in ohmic junction with the second nitride semiconductor layer.

In the preferred embodiment of the present invention, a metal material of the gate electrode differs from a metal material of the source electrode and the drain electrode.

In the preferred embodiment of the present invention, the first semiconductor gate layer is constituted of a p type GaN layer and the second semiconductor gate layer is constituted of an $Al_xGa_{1-x}N$ ($0 \leq x \leq 1$) layer.

In the preferred embodiment of the present invention, an Al composition of the second semiconductor gate layer is not less than 15%.

In the preferred embodiment of the present invention, the Al composition of the second semiconductor gate layer is low in a vicinity of the first semiconductor gate layer and high in a vicinity of the gate electrode.

In the preferred embodiment of the present invention, the Al composition of the second semiconductor gate layer is high in a vicinity of the first semiconductor gate layer and low in a vicinity of the gate electrode.

In the preferred embodiment of the present invention, the second semiconductor gate layer contains a donor type impurity.

In the preferred embodiment of the present invention, a film thickness of the first semiconductor gate layer is not less than 50 nm.

In the preferred embodiment of the present invention, the film thickness of the first semiconductor gate layer is not less than 70 nm.

In the preferred embodiment of the present invention, a film thickness of the second semiconductor gate layer is not less than 3 nm and not more than 15 nm.

In the preferred embodiment of the present invention, a width of the second semiconductor gate layer is substantially equal to a width of the first semiconductor gate layer, the second semiconductor gate layer covers an entire front surface of the first semiconductor gate layer, the gate electrode is formed on a widthwise intermediate portion of a front surface of the second semiconductor gate layer, and the gate electrode does not contact a width direction end of the second semiconductor gate layer.

In the preferred embodiment of the present invention, the gate electrode is constituted of TiN, TiW, or Ti or a combination of these.

In the preferred embodiment of the present invention, the gate electrode contains two or more combinations of TiN that differ in composition ratio.

In the preferred embodiment of the present invention, the second nitride semiconductor layer is constituted of an AlGaN layer, the first semiconductor gate layer is constituted of a p type GaN layer, the second semiconductor gate layer is constituted of an AlGaN layer, a third nitride semiconductor layer that is constituted of an AlGaN layer of higher Al composition than the second nitride semiconductor layer is formed on the second nitride semiconductor layer, and the gate portion is formed on the third nitride semiconductor layer.

In the preferred embodiment of the present invention, a removed portion in which a portion of the third nitride semiconductor layer is removed is formed in a region between the gate portion and the drain electrode.

A method for manufacturing a nitride semiconductor device according to a preferred embodiment of the present invention includes a first step of forming a first nitride semiconductor layer that constitutes an electron transit layer, a second nitride semiconductor layer that constitutes an electron supply layer, a first semiconductor gate material film that is constituted of a nitride semiconductor containing an acceptor type impurity, and a second semiconductor gate material film that is constituted of a nitride semiconductor with a larger bandgap than the first semiconductor gate material film in that order on a substrate, a second step of forming a gate electrode film such as to be in Schottky junction with the second semiconductor gate material film, a third step of selectively removing the gate electrode film, the second semiconductor gate material film, and the first semiconductor gate material film to form, on the second nitride semiconductor layer, a gate portion that constituted of a first semiconductor gate layer of a ridge shape, a second semiconductor gate layer formed on the first semiconductor gate layer, and a gate electrode formed on the second semiconductor gate layer, a fourth step of forming a dielectric film that covers exposed surfaces of the second nitride semiconductor layer and the gate portion, and a fifth step of forming a source electrode and a drain electrode that penetrate through the dielectric film and are in ohmic junction with the second nitride semiconductor layer.

In the preferred embodiment of the present invention, the first semiconductor gate material film is constituted of a p type GaN, the second semiconductor gate material film is constituted of an AlGaN, and the gate electrode film is constituted of TiN, TiW, or Ti or a combination of these.

In the preferred embodiment of the present invention, the gate electrode contains two or more combinations of TiN that differ in composition ratio.

In the preferred embodiment of the present invention, the third step includes a first etching step of selectively removing the gate electrode film and the second semiconductor gate material film by dry etching to form the gate electrode and the second semiconductor gate layer and a second etching step of selectively removing the first semiconductor gate material film by dry etching to form the first semiconductor gate layer and an etching gas used in the first etching step differs from an etching gas used in the second etching step.

In the preferred embodiment of the present invention, the etching gas used in the first etching step is a gas that does not contain oxygen and the etching gas used in the second etching step is a gas that contains at least chlorine gas and oxygen.

In the preferred embodiment of the present invention, the first etching step is constituted of a first a etching step of etching the gate electrode film and a first b etching step of etching the second semiconductor gate material film and the etching gas used in the first a etching step is a gas that does not contain oxygen and the etching gas used in the first h etching step is a gas that contains at least chlorine but does not contain oxygen.

The aforementioned as well as yet other objects, features, and effects of the present invention will be made clear by the following description of the preferred embodiments made with reference to the accompanying drawings.

BRIEF DESCRIPTION OF DRAWINGS

FIG. 9 is a sectional view for describing the arrangement of a nitride semiconductor device according to a fifth preferred embodiment of the present invention.

DESCRIPTION OF EMBODIMENTS

Figure 1:
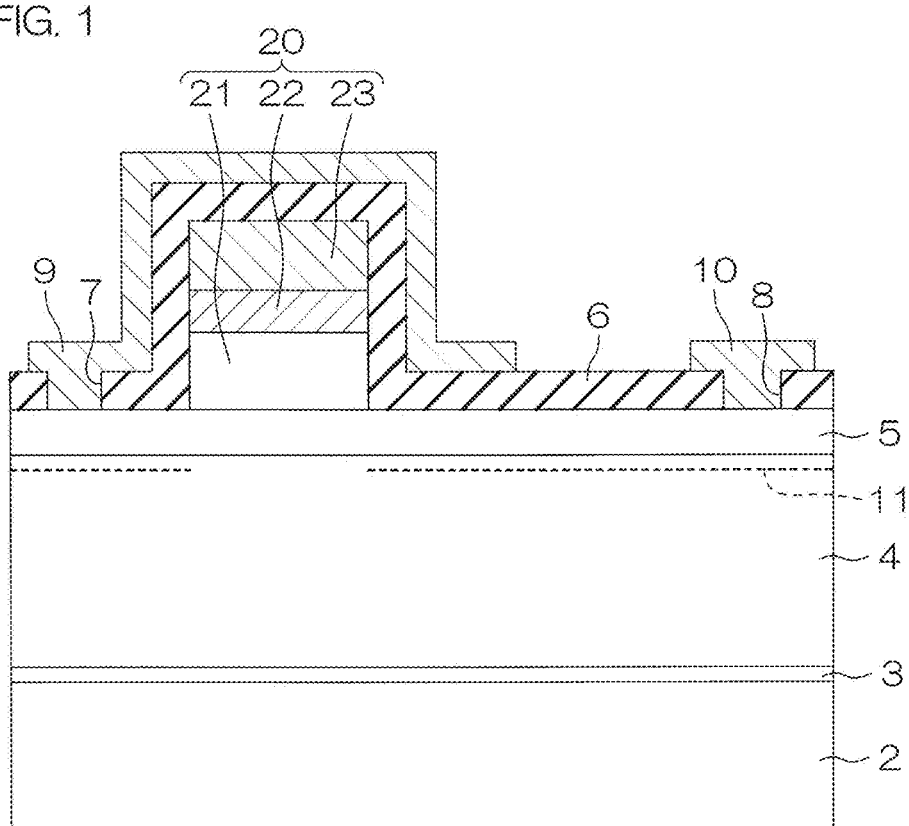
FIG. 1 is a sectional view for describing the arrangement of a nitride semiconductor device according to a first preferred embodiment of the present invention.

FIG. 1 is a sectional view for describing the arrangement of a nitride semiconductor device according to a first preferred embodiment of the present invention.

The nitride semiconductor device 1 includes a substrate 2, a buffer layer 3 that is formed on a front surface of the substrate 2, a first nitride semiconductor layer 4 that is epitaxially grown on the buffer layer 3, a second nitride semiconductor layer 5 that is epitaxially grown on the first nitride semiconductor layer 4, and a gate portion 20 formed on the second nitride semiconductor layer 5.

Further, the nitride semiconductor device includes a passivation film 6 (dielectric film) that covers the second nitride semiconductor layer 5 and the gate portion 20. Further, the nitride semiconductor device 1 includes a source electrode 9 and a drain electrode 10 that penetrate through a source contact hole 7 and a drain contact hole 8 formed in the passivation film 6 and are in ohmic contact with the second nitride semiconductor layer 5. The source electrode 9 and the drain electrode 10 are disposed at an interval. The source electrode 9 is formed such as to cover the gate portion 20.

The substrate 2 may, for example, be a silicon substrate of low resistance. The silicon substrate of low resistance may be a p type substrate having an electric resistivity of, for example, 0.001 Ωmm to 0.5 Ωmm (more specifically, approximately 0.01 Ωmm to 0.1 Ωmm). Also, besides a silicon substrate of low resistance, the substrate 2 may instead be a SiC substrate of low resistance, a GaN substrate of low resistance, etc. The substrate 2 has a thickness, for example, of approximately 650 μm during a semiconductor process and is ground to not more than approximately 300 μm in a preliminary stage before being made into a chip. The substrate 2 is electrically connected to the source electrode 9.

In this preferred embodiment, the buffer layer 3 is constituted of a multilayer buffer layer in which a plurality of nitride semiconductor films are laminated. In this preferred embodiment, the buffer layer 3 is constituted of a first buffer layer (not shown) constituted of an AlN film in contact with the front surface of the substrate 2 and a second buffer layer (not shown) constituted of an AlN/AlGaN super lattice layer laminated on a front surface of the first buffer layer (the front surface at an opposite side to the substrate 2 side). A film thickness of the first buffer layer is approximately 100 nm to 500 nm. A film thickness of the second buffer layer is approximately 500 nm to 2 μm. The buffer layer 3 may instead be constituted, for example, of a single film or a composite film of AlGaN.

The first nitride semiconductor layer 4 constitutes an electron transit layer. In this preferred embodiment, the first nitride semiconductor layer 4 is constituted of a GaN layer and a thickness thereof is approximately 0.5 μm to 2 μm. Also, an impurity for making a region other than a front surface region semi-insulating may be introduced for a purpose of suppressing a leak current that flows through the first nitride semiconductor layer 4. In this case, a concentration of the impurity is preferably not less than $4 \times 10^{16}$ $cm^{-3}$. Also, the impurity is, for example, C or Fe.

The second nitride semiconductor layer 5 constitutes an electron supply layer. The second nitride semiconductor layer 5 is constituted of a nitride semiconductor with a larger bandgap than the first nitride semiconductor layer 4. Specifically, the second nitride semiconductor layer 5 is constituted of a nitride semiconductor with a higher Al composition than the first nitride semiconductor layer 4. In a nitride semiconductor, the higher the Al composition, the larger the bandgap. In this preferred embodiment, the second nitride semiconductor layer 5 is constituted of an $Al_xGa_{1-x}N$ layer ($0 \leq x \leq 1$) and a thickness thereof is approximately 5 nm to 15 nm.

The first nitride semiconductor layer (electron transit layer) 4 and the second nitride semiconductor layer (electron supply layer) 5 are thus constituted of nitride semiconductors that differ in bandgap (Al composition) and a lattice mismatch occurs therebetween. Also, due to spontaneous polarizations of the first nitride semiconductor layer 4 and the second nitride semiconductor layer 5 and a piezo polarization due to the lattice mismatch between the two, an energy level of a conduction band of the first nitride semiconductor layer 4 at an interface between the first nitride semiconductor layer 4 and the second nitride semiconductor layer 5 is made lower than a Fermi level. Thereby, inside the first nitride semiconductor layer 4, a two-dimensional electron gas (2DEG) 11 spreads at a position close to the interface between the first nitride semiconductor layer 4 and the second nitride semiconductor layer 5 (for example, at a distance of only several Å from the interface).

The gate portion 20 includes a first semiconductor gate layer 21 of a ridge shape that is epitaxially grown on the second nitride semiconductor layer 5, a second semiconductor gate layer 22 that is formed on the first semiconductor gate layer 21, and a gate electrode 23 that is formed on the second semiconductor gate layer 22. The gate portion 20 is disposed biasedly toward the source contact hole 7.

In this preferred embodiment, a lateral cross sectional shape of the first semiconductor gate layer 21 is substantially rectangular. The first semiconductor gate layer 21 is constituted of a nitride semiconductor doped with an acceptor type impurity. In this preferred embodiment, the first semiconductor gate layer 21 is constituted of a GaN layer (p type GaN layer) doped with the acceptor type impurity and a thickness thereof is approximately 60 nm. For a threshold voltage to be of an appropriate magnitude, the film thickness of the first semiconductor gate layer 21 is preferably not less than 50 nm and not more than 100 nm and more preferably not less than 70 nm and not more than 100 nm.

A concentration of the acceptor type impurity implanted in the first semiconductor gate layer 21 is preferably not less than $1 \times 10^{19}$ $cm^{-3}$. In this preferred embodiment, the acceptor type impurity is Mg (magnesium). The acceptor type impurity may instead be Zn (zinc) or other acceptor type impurity besides Mg. The first semiconductor gate layer 21 is provided to cancel out the two-dimensional electron gas 11 formed near the interface between the first nitride semiconductor layer 4 (electron transit layer) and the second nitride semiconductor layer 5 (electron supply layer) in a region directly below the gate portion 20.

The second semiconductor gate layer 22 is constituted of a nitride semiconductor with a larger bandgap than the first semiconductor gate layer 21. In this preferred embodiment, the second semiconductor gate layer 22 is constituted of an $Al_xGa_{1-x}N$ ($0 \leq x < 1$) layer and a thickness thereof is approximately 10 nm. If the acceptor type impurity implanted in the first semiconductor gate layer 21 is Mg, Mg is implanted in the second semiconductor gate layer 22 by a memory effect. An Al composition and a film thickness of the second semiconductor gate layer 22 that are favorable shall be described later.

The gate electrode 23 is in Schottky junction with the second semiconductor gate layer 22. The gate electrode 23 is constituted of TiN layer. A film thickness of the gate electrode 23 is approximately 50 nm to 150 nm. The gate electrode 23 may instead be constituted of TiN, TiW, or Ti or a combination of these. Also, the gate electrode 23 may contain combinations of TiN that differ in composition ratio.

The passivation film 6 covers a front surface of the second nitride semiconductor layer 5 (with the exception of regions facing the contact holes 7 and 8) and side surfaces and a front surface of the gate portion 20. In this preferred embodiment, the passivation film 6 is constituted of an SiN film and a thickness thereof is approximately 50 nm to 200 nm. The passivation film 6 may be constituted of SiN, $SiO_2$, SiON, or a composite film of these.

The source electrode 9 and the drain electrode 10 are constituted, for example, of first metal layers (ohmic metal layers) that are in ohmic contact with the second nitride semiconductor layer 5, second metal layers (main electrode metal layers) that are laminated on the first metal layers, third metal layers (adhesion layers) that are laminated on the second metal layers, and fourth metal layers (barrier metal layers) that are laminated on the third metal layers. The first metal layers are, for example, Ti layers with thicknesses of approximately 10 nm to 20 nm. The second metal layers are, for example, Al layers with thicknesses of approximately 100 nm to 300 nm. The third metal layers are, for example, Ti layers with thicknesses of approximately 10 nm to 20 nm. The fourth metal layers are, for example, TiN layers with thicknesses of approximately 10 nm to 50 nm.

In the nitride semiconductor device 1, a heterojunction is formed by there being formed on the first nitride semiconductor layer 4 (electron transit layer), the second nitride semiconductor layer 5 (electron supply layer) that differs in bandgap (Al composition). The two-dimensional electron gas 11 is thereby formed inside the first nitride semiconductor layer 4 near the interface between the first nitride semiconductor layer 4 and the second nitride semiconductor layer 5, and an HEMT making use of the two-dimensional electron gas 11 as a channel is formed. The gate electrode 23 faces the second nitride semiconductor layer 5 across the second semiconductor gate layer 22 and the first semiconductor gate layer 21.

Below the gate electrode 23, energy levels of the first nitride semiconductor layer 4 and the second nitride semiconductor layer 5 are pulled up by the ionized acceptors contained in the first semiconductor gate layer 21 that is constituted of the p type GaN layer. The energy level of the conduction band at the heterojunction interface between the first nitride semiconductor layer 4 and the second nitride semiconductor layer 5 is thus made higher than the Fermi level Therefore, the two-dimensional electron gas 11 formed by the spontaneous polarizations of the first nitride semiconductor layer 4 and the second nitride semiconductor layer 5 and the piezo polarization due to the lattice mismatch of the two layers is not formed directly below the gate electrode 23 (gate portion 20).

Therefore, when a bias is not applied to the gate electrode 23 (zero bias state), the channel due to the two-dimensional electron gas 11 is interrupted directly below the gate electrode 23. A normally-off type HEMT is thus realized. When an appropriate on voltage (for example, of 5 V) is applied to the gate electrode 23, a channel is induced inside the first nitride semiconductor layer 4 directly below the gate electrode 23 and the two-dimensional electron gas 11 at both sides of the gate electrode 23 becomes connected. The source and the drain are thereby made continuous to each other.

For use, for example, a predetermined voltage (for example, of 10 V to 500 V) with which the drain electrode 10 side becomes positive is applied between the source electrode 9 and the drain electrode 10. In this state, an off voltage (0 V) or the on voltage (5 V) is applied to the gate electrode 23 with the source electrode 9 being at a reference potential (0 V).

FIG. 2A to FIG. 2F are sectional views for describing an example of a manufacturing process of the nitride semiconductor device 1 descried above and show a cross-sectional structure at a plurality of stages in the manufacturing process.

Figure 2A:
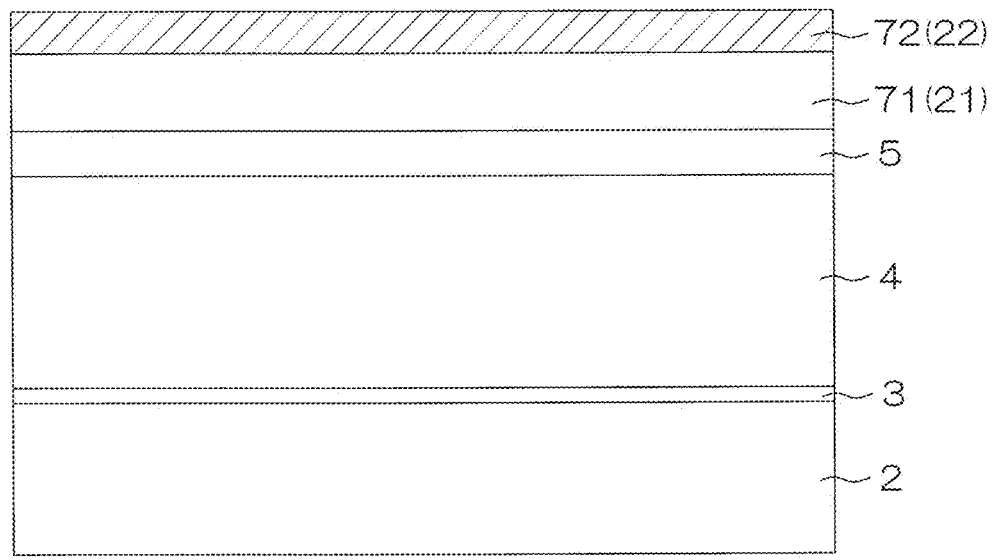
FIG. 2A is a sectional view of an example of a manufacturing process of the nitride semiconductor device shown in FIG. 1.

First, as shown in FIG. 2A, the buffer layer 3, the first nitride semiconductor layer (electron transit layer) 4, and the second nitride semiconductor layer (electron supply layer) 5 are epitaxially grown on the substrate 2 by an MOCVD (metal organic chemical vapor deposition) method. Further, a first semiconductor gate material film 71 that is a material film of the first semiconductor gate layer 21 and a second semiconductor gate material film 72 that is a material film of the second semiconductor gate layer 22 are epitaxially grown on the second nitride semiconductor layer 5 by the MOCVD method.

Figure 2B:
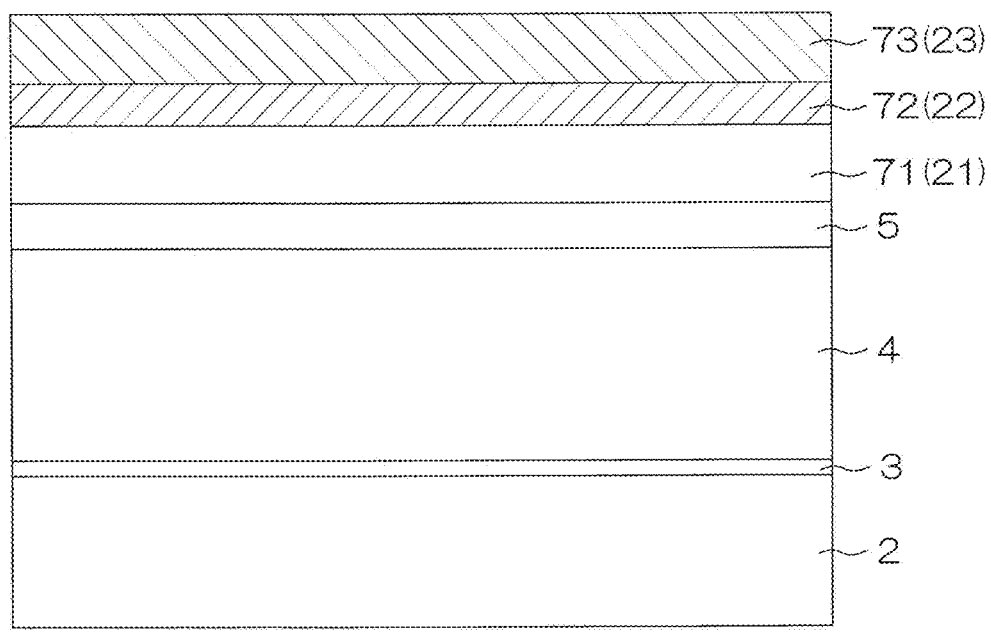
FIG. 2B is a sectional view of a step subsequent to that of FIG. 2A.

Next, as shown in FIG. 2B, a gate electrode film 73 that is a material film of the gate electrode 23 is formed by a sputtering method such as to cover an entire front surface that is exposed.

Figure 2C:
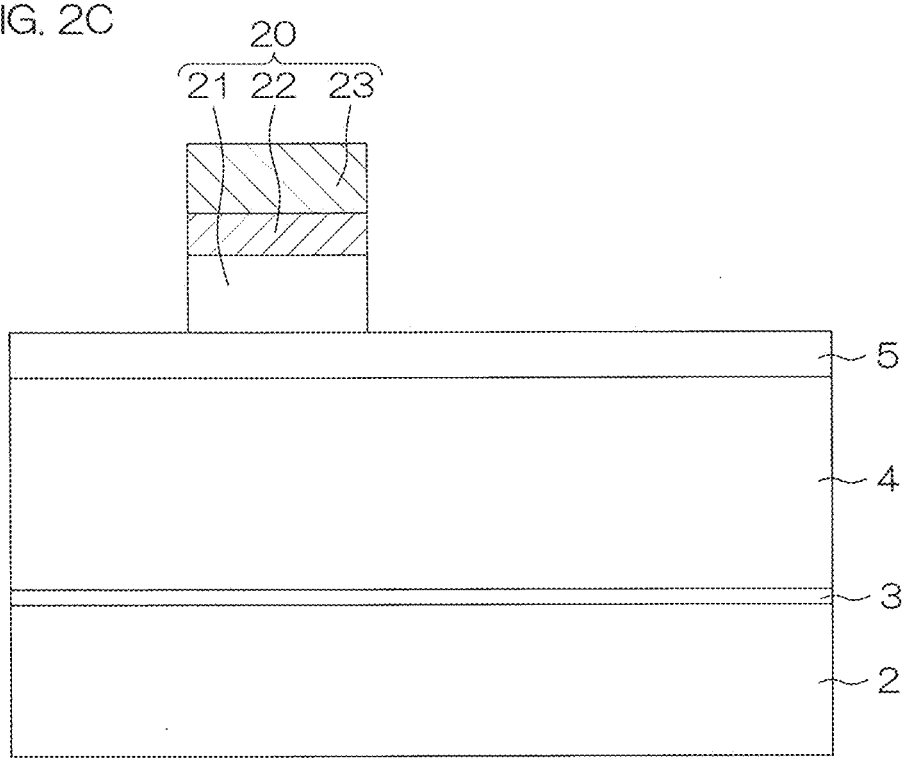
FIG. 2C is a sectional view of a step subsequent to that of FIG. 2B.

Next, as shown in FIG. 2C, patterning by photolithography and dry etching is performed, first on the gate electrode film 73 and the second semiconductor gate material film 72. In the dry etching step, a gas that does not contain oxygen is used as an etching gas. Examples of the etching gas include $Cl_2/BCl_3$, $BCl_3$, and $CF_4$ and these may be combined in stages in accordance with an etching object.

Here, the step of etching the gate electrode film 73 and the second semiconductor gate material film 72 is constituted of a step of etching the gate electrode film 73 and a step of etching the second semiconductor gate material film 72. The etching gas used in the step of etching the gate electrode film 73 is, for example, a gas that does not contain oxygen and the etching gas used in the step of etching the second semiconductor gate material film 72 is, for example, a gas that contains at least chlorine but does not contain oxygen.

Thereafter, the first semiconductor gate material film 71 is patterned by dry etching. In the dry etching step, a gas that contains at least chlorine gas and oxygen is used as an etching gas. Examples of the etching gas include $Cl_2/O_2/N_2$ and $Cl_2/O_2/Ar$.

The gate portion 20 constituted of the first semiconductor gate layer 21 of a ridge shape, the second semiconductor gate layer 22 formed on the first semiconductor gate layer 21, and the gate electrode 23 formed on the second semiconductor gate layer 22 is thereby formed on the second nitride semiconductor layer 5.

Figure 2D:
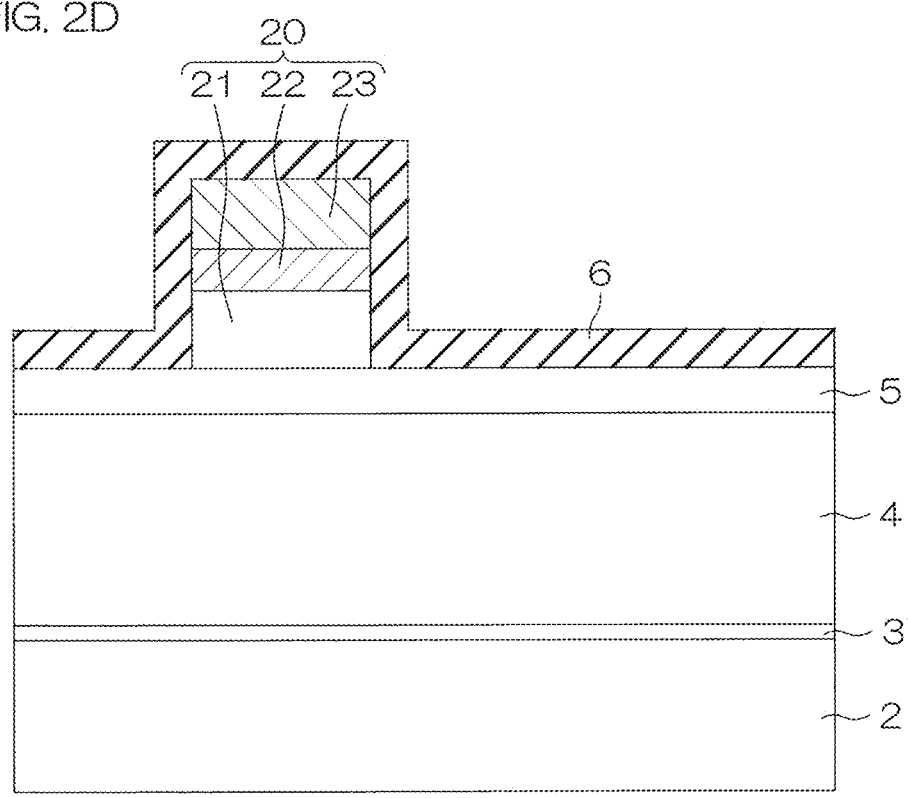
FIG. 2D is a sectional view of a step subsequent to that of FIG. 2C.

Next, as shown in FIG. 2D, the passivation film 6 is formed such as to cover entire surfaces that are exposed. The passivation film 6 is constituted, for example, of SiN.

Figure 2E:
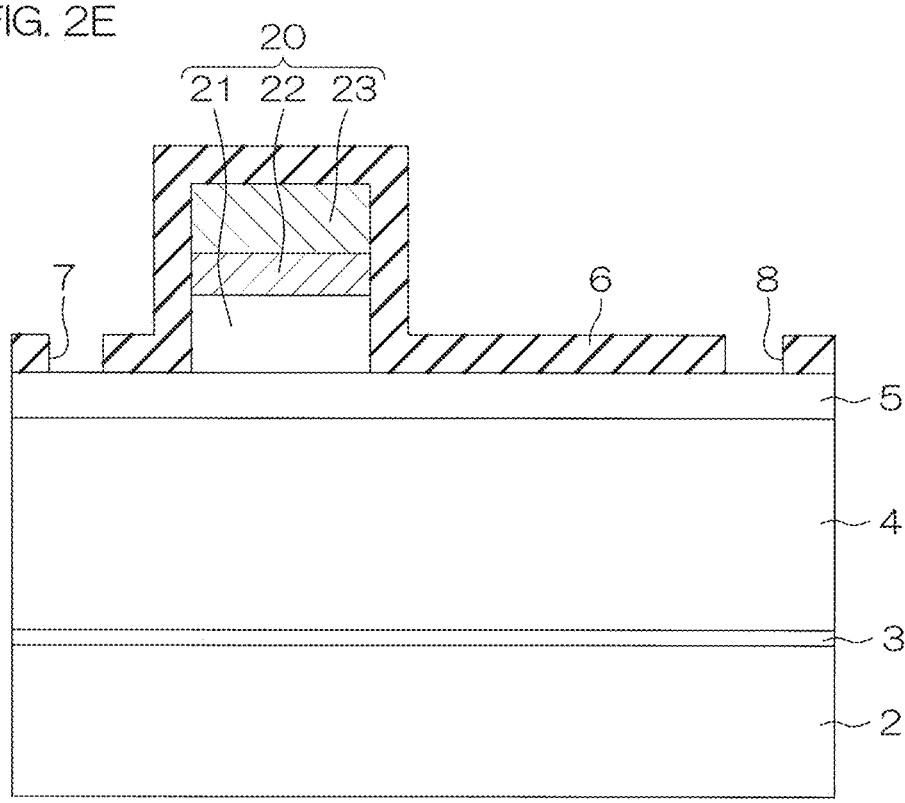
FIG. 2E is a sectional view of a step subsequent to that of FIG. 2D.

Next, as shown in FIG. 2E, the source contact hole 7 and the drain contact hole 8 that reach the second nitride semiconductor layer 5 are formed in the passivation film 6.

Figure 2F:
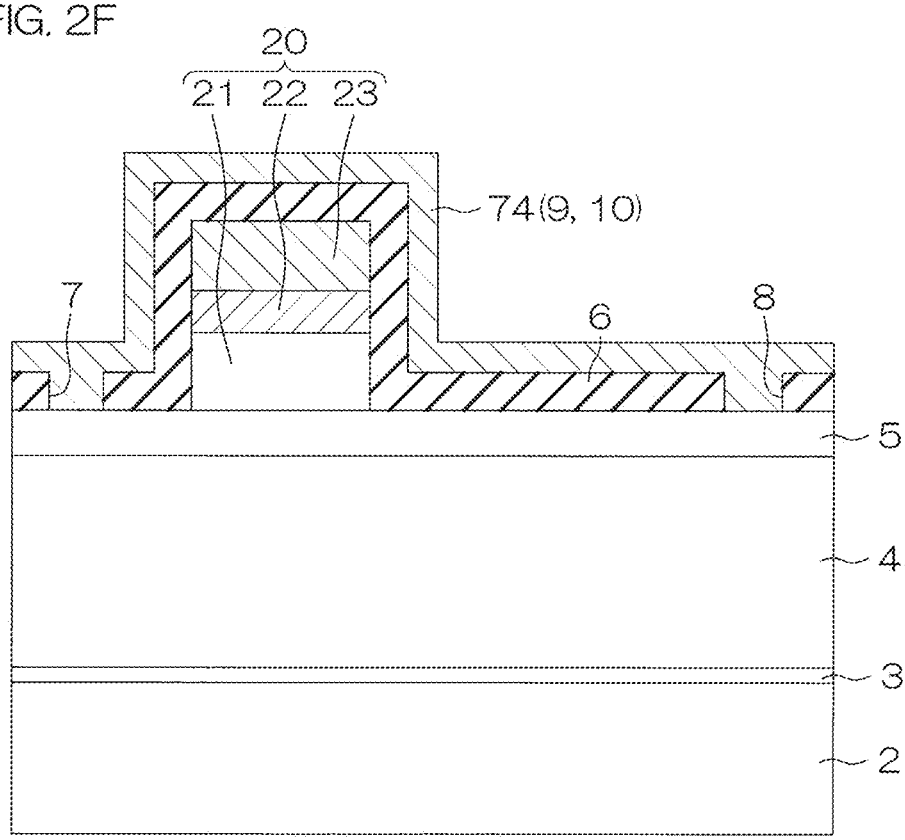
FIG. 2F is a sectional view of a step subsequent to that of FIG. 2E.

Next, as shown in FIG. 2F, a source/drain electrode film 74 is formed such as to cover entire surfaces that are exposed.

Lastly, the source/drain electrode film 74 is patterned by photolithography and etching to form the source electrode 9 and the drain electrode 10 that are in ohmic contact with the second nitride semiconductor layer 5. The nitride semiconductor device 1 with the structure such as shown in FIG. 1 is thereby obtained.

A nitride semiconductor device in which both of the first semiconductor gate layer 21 and the second semiconductor gate layer 22 in the first preferred embodiment described above are constituted of the first semiconductor gate layer (p type GaN) 21 shall be deemed to be a first comparative example.

Figure 3:
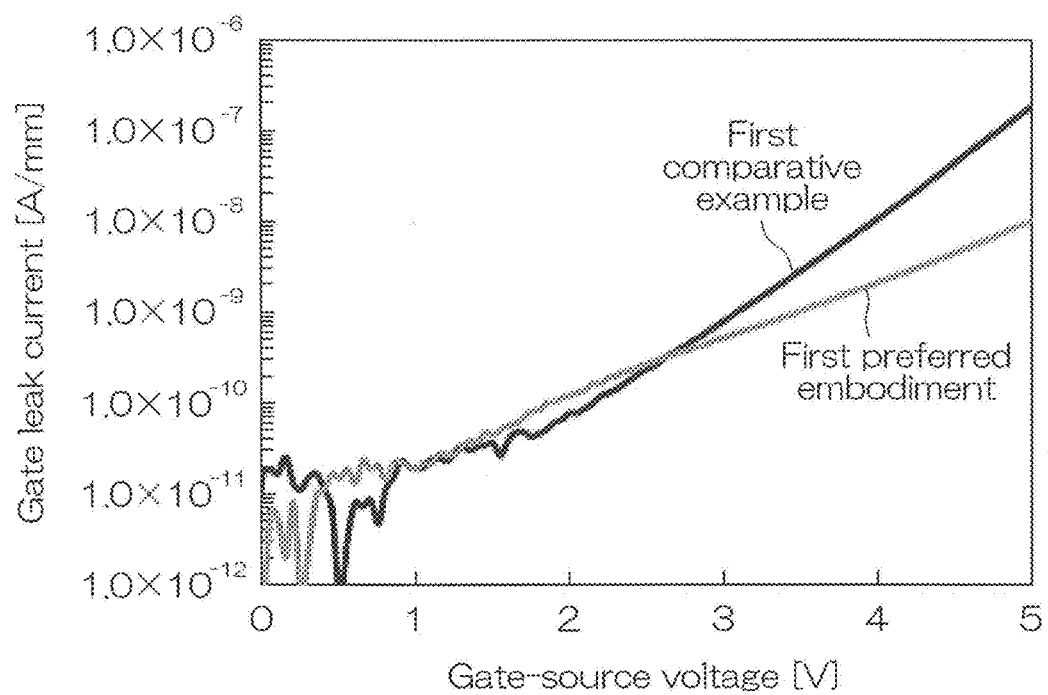
FIG. 3 is a graph of experiment results of gate-source leak current [A/nm] versus gate-source voltage [V].

FIG. 3 is a graph of experiment results of gate-source leak current [A/mm] versus gate-source voltage [V]. Here, an Al composition of the second semiconductor gate layer (AlGaN) 22 of the first preferred embodiment is 20% and the film thickness of the second semiconductor gate layer 22 is 10 nm.

From FIG. 3, it can be understood that in a range where the gate-source voltage is not less than approximately 2.8 [V], the leak current between gate and source is reduced in the first preferred embodiment in comparison to the first comparative example.

A reason why the leak current between gate and source is reduced in the preferred embodiment in comparison to the first comparative example shall now be explained.

Figure 4:
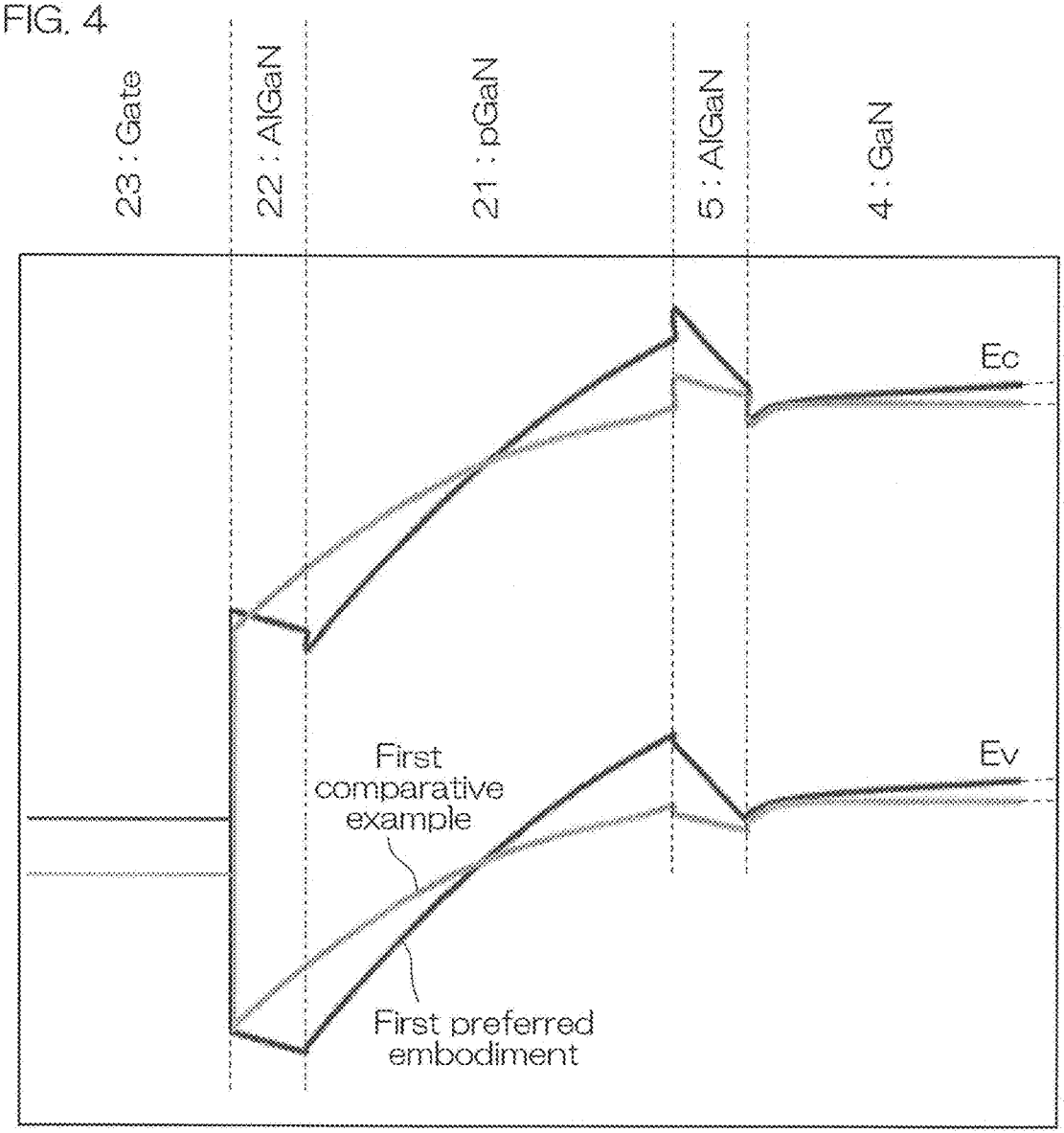
FIG. 4 is an energy band diagram showing energy distributions of a first preferred embodiment and first comparative example.

FIG. 4 is an energy band diagram showing energy distributions of the first preferred embodiment and first comparative example.

In FIG. 4, GaN indicates the first nitride semiconductor layer 4, the adjacent AlGaN indicates the second nitride semiconductor layer 5, the next adjacent pGan indicates the first semiconductor gate layer 21, the next adjacent AlGaN indicates the second semiconductor gate layer 22, and the next adjacent Gate indicates the gate electrode 23. Also, in FIG. 4, Ec is an energy level of a conduction band and Ev is an energy level of a valence band.

As can be understood from the energy level Ev of the valence band in the first preferred embodiment shown in FIG. 4, a barrier against holes is formed in the valence band at a boundary between the first semiconductor gate layer (pGaN) 21 and the second semiconductor gate layer (AlGaN) 22 in the first preferred embodiment. Implantation of holes from the gate electrode (Gate) 23 to the first semiconductor gate layer (pGaN) 21 can thereby be suppressed. On the other hand, a barrier against holes is not formed between the gate electrode 23 and the first semiconductor gate layer (pGaN) 21 in the first comparative example. This is the reason why the leak current is reduced in the first preferred embodiment in comparison to the first comparative example.

To appropriately form a barrier against holes in the valence band at the boundary between the first semiconductor gate layer 21 and the second semiconductor gate layer 22, it is preferable for the Al composition of the second semiconductor gate layer 22 to be not less than 15%. Also, in consideration of in-plane variation within a wafer, a sufficient barrier cannot be formed in a layer that is too small and therefore, the film thickness of the second semiconductor gate layer 22 is preferably not less than 3 nm. Also, in this case, since Mg will be introduced into the second semiconductor gate layer 22 by the memory effect if the acceptor impurity introduced into the first semiconductor gate layer 21 is Mg, influence thereof can also be relaxed. On the other hand, if the film thickness of the second semiconductor gate layer 22 is too large, a crack may form due to lattice mismatch with the first semiconductor gate layer 21 and therefore, the film thickness of the second semiconductor gate layer 22 is preferably not more than 15 nm.

In the first preferred embodiment described above, the gate electrode 23 is in Schottky junction with the second semiconductor gate layer 22 and therefore, the leak current can be reduced in comparison to a case where the gate electrode 23 is in ohmic junction with the second semiconductor gate layer 22. This is because with the first preferred embodiment, a diode with which a forward direction is a direction directed from the second semiconductor gate layer 22 to the gate electrode 23 is formed at the Schottky junction portion of the gate electrode 23 and the second semiconductor gate layer 22 and therefore, a current is unlikely to flow from the gate electrode 23 to the first semiconductor gate layer 21 when a positive voltage is applied to the gate voltage 23 side as seen from the source electrode 9.

Figure 5:
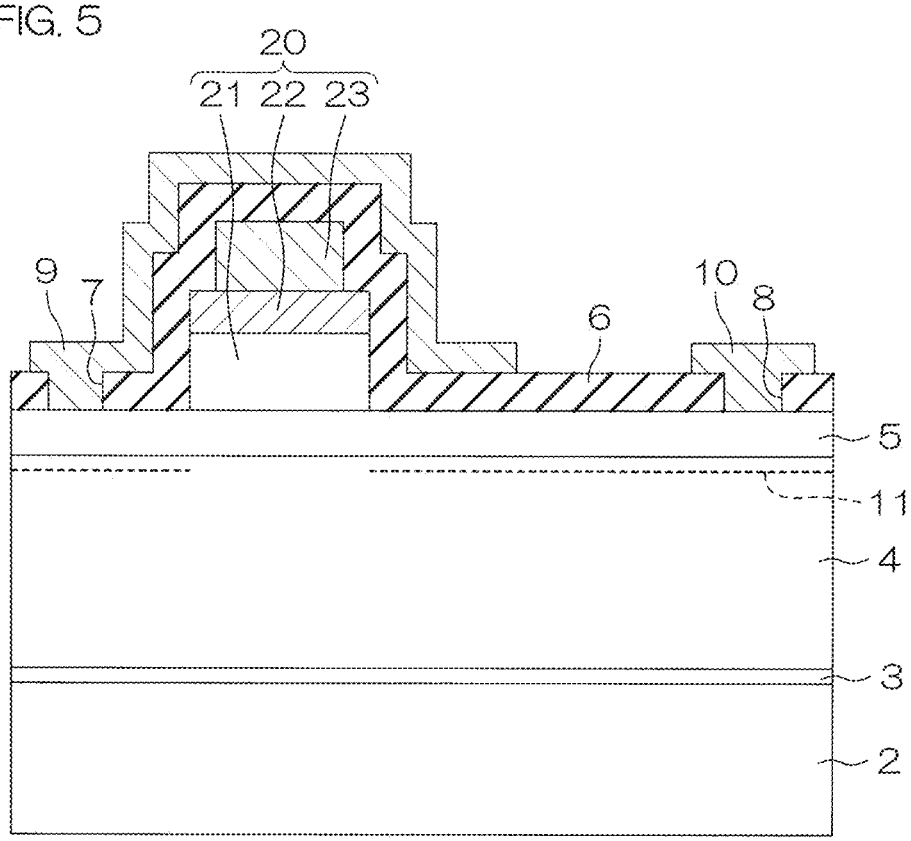
FIG. 5 is a sectional view for describing the arrangement of a nitride semiconductor device according to a second preferred embodiment of the present invention.

FIG. 5 is a sectional view for describing the arrangement of a nitride semiconductor device according to a second preferred embodiment of the present invention. In FIG. 5, portions corresponding to respective portions of FIG. 1 described above are indicated with the same reference signs attached as in FIG. 1.

With the nitride semiconductor device 1A of FIG. 5, although a width of the first semiconductor gate layer 21 and a width of the second semiconductor gate layer 22 are substantially equal, a width of the gate electrode 23 is shorter than the width of the second semiconductor gate layer 22. The second semiconductor gate layer 22 covers an entirety of a front surface (upper surface) of the first semiconductor gate layer 21. The gate electrode is formed on a widthwise intermediate portion of a front surface of the second semiconductor gate layer 22 and does not contact both side edges (width direction ends) of the front surface of the second semiconductor gate layer 22.

An arrangement where, with respect to the nitride semiconductor device 1A of FIG. 5, the second semiconductor gate layer 22 is not formed and the gate electrode 23 is formed on a width intermediate portion of the upper surface of the first semiconductor gate layer 21 shall be deemed to be a second comparative example.

Figure 6A:
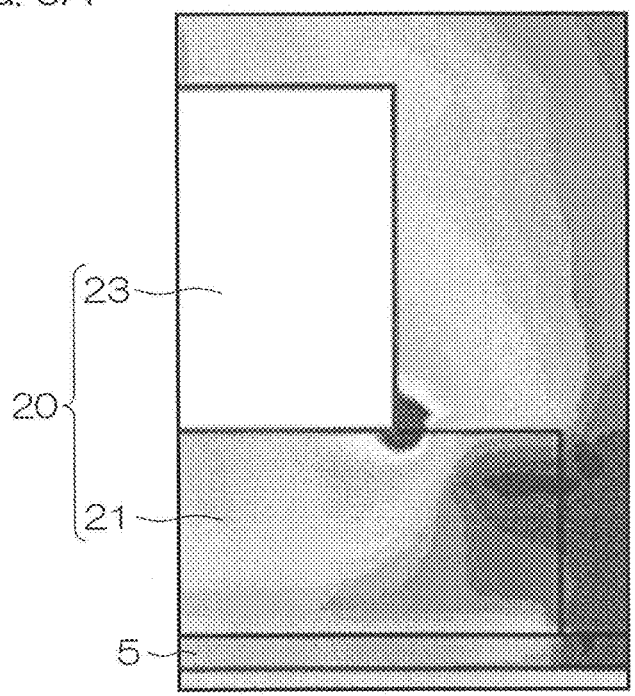
FIG. 6A is a schematic view of a field strength distribution near one side portion of a gate portion of a second comparative example when an on voltage is applied to a gate electrode.
Figure 6B:
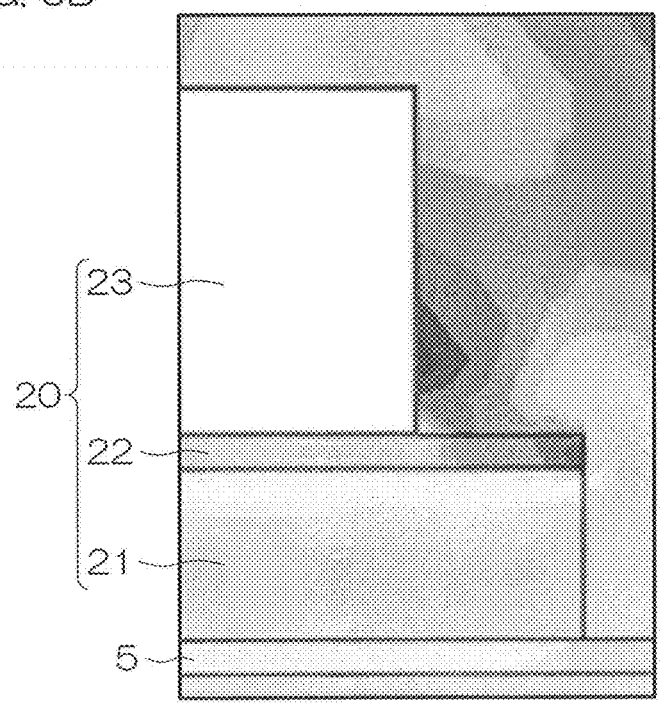
FIG. 6B is a schematic view of a field strength distribution near one side portion of the gate portion of a second preferred embodiment when the on voltage is applied to the gate electrode.

FIG. 6A is a schematic view of a field strength distribution near one side portion of the gate portion 20 of the second comparative example when the on voltage (5V) is applied to the gate electrode 23. FIG. 6B is a schematic view of a field strength distribution near one side portion of the gate portion 20 of the second preferred embodiment when the on voltage (5V) is applied to the gate electrode 23.

As shown in FIG. 6A, with the second comparative example, there is a concentration of electric field at a contact portion of the upper surface of the first semiconductor gate layer 21 and a side edge of a lower surface of the gate electrode 23. On the other hand, as shown in FIG. 6B, with the second preferred embodiment, there is no longer a concentration of electric field at a side edge portion (width direction end) of the lower surface of the gate electrode 23. This is considered to be because in the second preferred embodiment, by influence of the two-dimensional electron gas formed at the boundary between the first semiconductor gate layer (p type GaN) 21 and the second semiconductor gate layer (AGaN) 22, a potential in a lateral direction at a boundary portion is made uniform. Therefore, in the second preferred embodiment, a gate leak current from a width direction end of the gate electrode 23 is reduced in comparison to the second comparative example.

Figure 7:
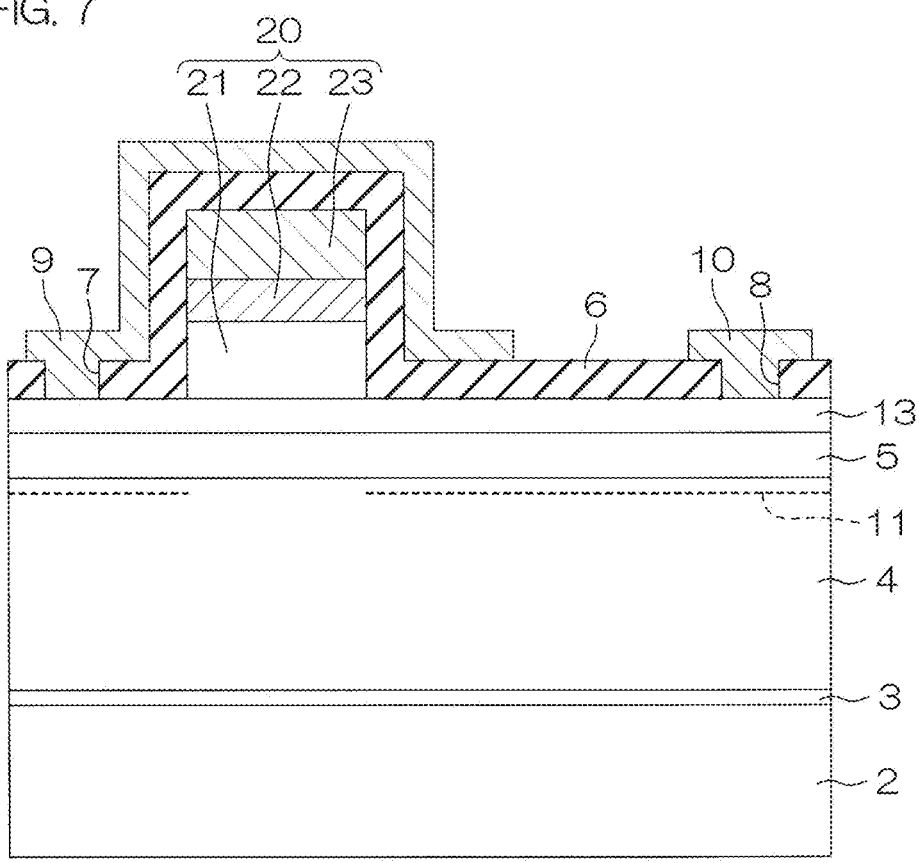
FIG. 7 is a sectional view for describing the arrangement of a nitride semiconductor device according to a third preferred embodiment of the present invention.

FIG. 7 is a sectional view for describing the arrangement of a nitride semiconductor device according to a third preferred embodiment of the present invention. In FIG. 7, portions corresponding to respective portions of FIG. 1 described above are indicated with the same reference signs attached as in FIG. 1.

The nitride semiconductor device 1B of FIG. 7 differs from the nitride semiconductor device 1 of FIG. 1 in the point that a third nitride semiconductor layer 13 is formed on the second nitride semiconductor layer 5. With the nitride semiconductor device 1B of FIG. 7, the gate portion 20 is formed on the third nitride semiconductor layer 13 and the passivation film 6 is formed such as to cover an exposed surface of the third nitride semiconductor layer 13 and exposed surfaces of the gate portion 20. The source electrode 9 and the drain electrode 10 penetrate through the passivation film 6 and are in ohmic contact with the third nitride semiconductor layer 13.

The third nitride semiconductor layer 13 is constituted of an AlGaN of higher Al composition than the second nitride semiconductor layer (electron supply layer) 5 that is constituted of an AlGaN. A film thickness of the third nitride semiconductor layer 13 is approximately 3 nm to 10 nm. Whereas the Al composition of the second nitride semiconductor layer 5 is approximately 15 to 25%, the Al composition of the third nitride semiconductor layer 13 is approximately 25 to 100%.

The third nitride semiconductor layer 13 is provided to prevent the second nitride semiconductor layer 5 as the electron supply layer from being etched during patterning of the gate portion 20 by etching. The third nitride semiconductor layer 13 thus has a function as an etching stop layer.

If the first semiconductor gate layer 21 inside the gate portion 20 is of a p type GaN and the second semiconductor gate layer 22 is of an AlGaN, an etching rate of the first semiconductor gate layer 21 is higher than an etching rate of the second semiconductor gate layer 22. Therefore, in patterning the gate portion 20 by etching, it is difficult to perform etching control such as not to etch the front surface of the second nitride semiconductor layer 5. The third nitride semiconductor layer 13 is thus formed on the front surface of the second nitride semiconductor layer 5 in the nitride semiconductor device 1B according to the third preferred embodiment.

Figure 8:
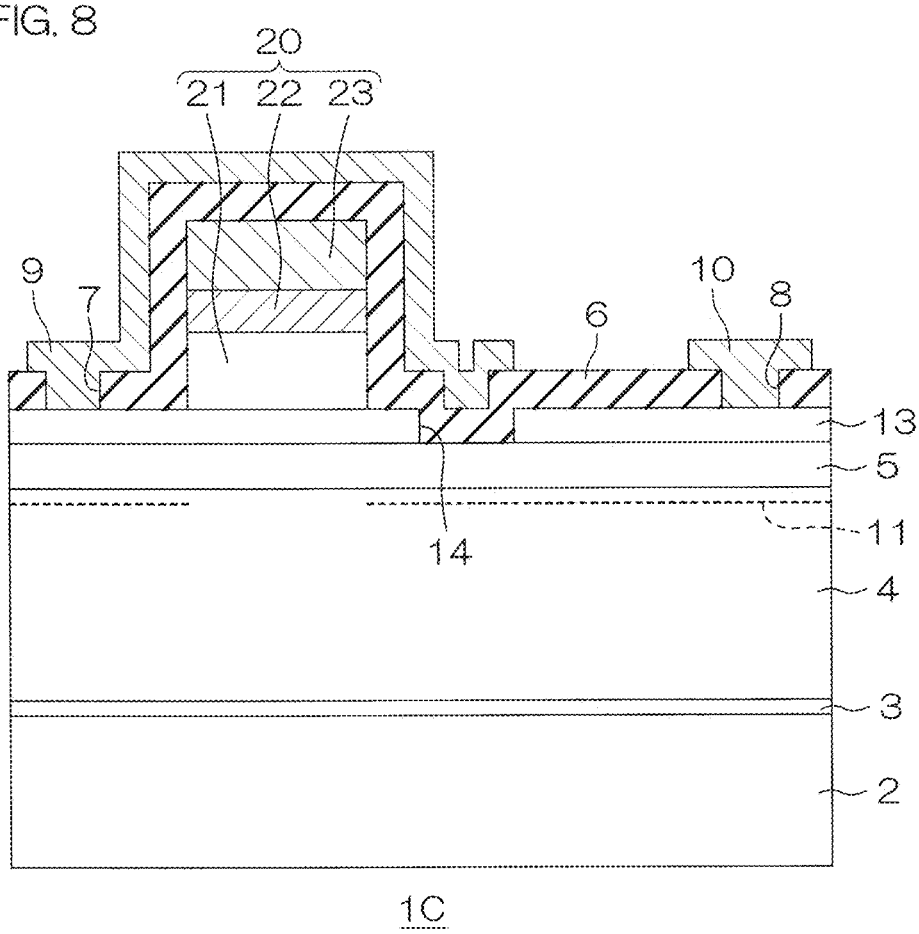
FIG. 8 is a sectional view for describing the arrangement of a nitride semiconductor device according to a fourth preferred embodiment of the present invention.

FIG. 8 is a sectional view for describing the arrangement of a nitride semiconductor device according to a fourth preferred embodiment of the present invention. In FIG. 8, portions corresponding to respective portions of FIG. 7 described above are indicated with the same reference signs attached as in FIG. 7.

The nitride semiconductor device 1C of FIG. 8 has substantially the same arrangement as the nitride semiconductor device 1B of FIG. 7. In the nitride semiconductor device 1C of FIG. 8, a removed region 14 in which the third nitride semiconductor layer 13 is not present on the second nitride semiconductor layer 5 is formed between the gate portion 20 and the drain electrode 10. A portion of the passivation film 6 is embedded in the removed region 14.

When the third nitride semiconductor layer 13 that is constituted of an AlGaN is formed on the second nitride semiconductor layer 5, a carrier concentration of the two-dimensional electron gas 11 due to the first semiconductor gate layer 21 increases in comparison to a case where the third nitride semiconductor layer 13 is not formed and therefore, a withstand voltage may decrease due to field concentration at a drain side end portion of the gate portion 20. Thus, in the nitride semiconductor device 1C of FIG. 8, a region of low two-dimensional electron gas density is formed between the gate portion 20 and the drain electrode 10 by the removed region 14 to relax the field concentration and improve the withstand voltage between drain and source.

FIG. 9 is a sectional view for describing the arrangement of a nitride semiconductor device according to a fifth preferred embodiment of the present invention. In FIG. 9, portions corresponding to respective portions of FIG. 1 described above are indicated with the same reference signs attached as in FIG. 1.

The nitride semiconductor device 1D of FIG. 9 differs from the nitride semiconductor device 1 of FIG. 1 in the structure (shape) of the gate portion 20. As with the nitride semiconductor device 1 of FIG. 1, the gate portion 20 is constituted of the first semiconductor gate layer 21 of a ridge shape, the second semiconductor gate layer 22 that is formed on the first semiconductor gate layer 21, and the gate electrode 23 that is formed on the second semiconductor gate layer 22 in the nitride semiconductor device 1D of FIG. 9 as well.

The first semiconductor gate layer 21 is constituted of a gate layer main body 21A with a cross-sectional shape being a laterally long rectangular shape and an upper protruding portion 21B that is formed on a widthwise intermediate portion of an upper surface of the gate layer main body 21A. The second semiconductor gate layer 22 is formed on the upper protruding portion 21B. The gate electrode 23 is formed on the second semiconductor gate layer 22.

With the nitride semiconductor device 1D of FIG. 9, an electric field can be concentrated at a location 31 at which the upper surface of the gate layer main body 21A and aside surface of the upper protruding portion 21B of the first semiconductor gate layer 21 intersect. A position at which the electric field concentrates can thereby be detached from width direction ends of the lower surface of the gate electrode 23. A gate leak current from a width direction end of the gate electrode 23 can thereby be suppressed.

Although the first to fifth preferred embodiments of the present invention have been described above, the present invention may be implemented in yet other preferred embodiments. For example, the Al composition in the second semiconductor gate layer 22 may be adjusted such that the Al composition in the second semiconductor gate layer 22 is low in a vicinity of the first semiconductor gate layer 21 and high in a vicinity of the gate electrode 23. By adjusting thus, a film forming property of the second semiconductor gate layer 22 with respect to the first semiconductor gate layer 21 becomes satisfactory.

Also, the Al composition in the second semiconductor gate layer 22 may be adjusted such that the Al composition in the second semiconductor gate layer 22 is high in a vicinity of the first semiconductor gate layer 21 and low in a vicinity of the gate electrode 23. When the Al composition in the second semiconductor gate layer 22 is thus high in the vicinity of the first semiconductor gate layer 21, a barrier against holes at an interface between the AlGaN of the second semiconductor gate layer 22 and the p type GaN of the first semiconductor gate layer 21 becomes high and therefore, an effect of suppressing a leak current that is based on holes can be enhanced.

Also, the second semiconductor gate layer 22 may contain a donor type impurity such as Si, etc. In this case, a Schottky barrier height between the second semiconductor gate layer 22 and the gate electrode 23 can be adjusted by adjusting the concentration of the donor type impurity.

Also, although with each of the preferred embodiments described above, silicon was taken up as an example of the material of the substrate 2, any substrate material besides this, such as a sapphire substrate, a GaN substrate, etc., may be applied.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2019-17335 filed on Feb. 1, 2019 in the Japan Patent Office, and the entire disclosure of this application is incorporated herein by reference.

REFERENCE SIGNS LIST 1, 1A, 1B, 1C, 1D Nitride semiconductor device
2 Substrate
3 Buffer layer
4 First nitride semiconductor layer
5 Second nitride semiconductor layer
6 Passivation film
7 Source contact hole
8 Drain contact hole
9 Source electrode
10 Drain electrode
11 Two-dimensional electron gas (2DEG)
13 Third nitride semiconductor layer
20 Gate portion
21 First semiconductor gate layer
21A Gate layer main body
21B Upper protruding portion
22 Second semiconductor gate layer
23 Gate electrode

The invention claimed is:

1. A nitride semiconductor device comprising:
a first nitride semiconductor layer that constitutes an electron transit layer;
a second nitride semiconductor layer that is formed on the first nitride semiconductor layer, is larger in bandgap than the first nitride semiconductor layer, and constitutes an electron supply layer; and
a gate portion that is formed on the second nitride semiconductor layer,
wherein the gate portion includes
a first semiconductor gate layer of a ridge shape that is disposed on the second nitride semiconductor layer and is constituted of a nitride semiconductor containing an acceptor type impurity,
a second semiconductor gate layer that is formed on the first semiconductor gate layer and is constituted of a nitride semiconductor with a larger bandgap than the first semiconductor gate layer, and
a gate electrode that is formed on the second semiconductor gate layer and is in Schottky junction with the second semiconductor gate layer,
wherein the second nitride semiconductor layer is constituted of an AlGaN layer, the first semiconductor gate layer is constituted of a p type GaN layer, and the second semiconductor gate layer is constituted of an AlGaN layer,
wherein a third nitride semiconductor layer that is constituted of an AlGaN layer of higher Al composition than the second nitride semiconductor layer is formed on the second nitride semiconductor layer,
wherein the gate portion is formed on the third nitride semiconductor layer, and
wherein a removed portion in which a portion of the third nitride semiconductor layer is removed is formed in a region between the gate portion and a drain electrode.

2. The nitride semiconductor device according to claim 1, further comprising:
a source electrode disposed on the second nitride semiconductor layer,
wherein the drain electrode is disposed on the second nitride semiconductor layer,
wherein the source electrode and the drain electrode are respectively in ohmic junction with the second nitride semiconductor layer.

3. The nitride semiconductor device according to claim 2, wherein a metal material of the gate electrode differs from a metal material of the source electrode and the drain electrode.

4. The nitride semiconductor device according to claim 1, wherein the second semiconductor gate layer is constituted of an $Al_xGa_{1-x}N$ ($0 \leq x < 1$) layer.

5. The nitride semiconductor device according to claim 4, wherein an Al composition of the second semiconductor gate layer is not less than 15%.

6. The nitride semiconductor device according to claim 1, wherein the second semiconductor gate layer contains a donor type impurity.

7. The nitride semiconductor device according to claim 1, wherein a film thickness of the first semiconductor gate layer is not less than 50 nm.

8. The nitride semiconductor device according to claim 1, wherein a film thickness of the first semiconductor gate layer is not less than 70 nm.

9. The nitride semiconductor device according to claim 1, wherein a film thickness of the second semiconductor gate layer is not less than 3 nm and not more than 15 nm.

10. The nitride semiconductor device according to claim 1, wherein a width of the second semiconductor gate layer is substantially equal to a width of the first semiconductor gate layer, the second semiconductor gate layer covers an entire front surface of the first semiconductor gate layer, the gate electrode is formed on a widthwise intermediate portion of a front surface of the second semiconductor gate layer, and the gate electrode does not contact a width direction end of the second semiconductor gate layer.

11. The nitride semiconductor device according to claim 1, wherein the gate electrode is constituted of TiN, TiW, or Ti or a combination of these.

12. The nitride semiconductor device according to claim 1, wherein the gate electrode contains two or more combinations of TiN that differ in composition ratio.

13. The nitride semiconductor device according to claim 1, further comprising:
a dielectric film that covers an exposed surface of the second nitride semiconductor layer and the gate portion; and
a source electrode that is disposed on the dielectric film to cover the gate portion,
wherein, in a region between the gate portion and the drain electrode, the source electrode includes:
a first portion that extends perpendicularly to a surface of the second nitride semiconductor layer along a side of the gate electrode through the dielectric film,
a second portion that extends downward from a lower portion of the first portion along a side of the first semiconductor gate layer through the dielectric film, and a third portion that is continuous with the second portion and extends in a direction parallel to the surface of the second nitride semiconductor layer.

14. A nitride semiconductor device comprising:
a first nitride semiconductor layer that constitutes an electron transit layer;
a second nitride semiconductor layer that is formed on the first nitride semiconductor layer, is larger in bandgap than the first nitride semiconductor layer, and constitutes an electron supply layer; and
a gate portion that is formed on the second nitride semiconductor layer,
wherein the gate portion includes
a first semiconductor gate layer of a ridge shape that is disposed on the second nitride semiconductor layer and is constituted of a nitride semiconductor containing an acceptor type impurity,
a second semiconductor gate layer that is formed on the first semiconductor gate layer and is constituted of a nitride semiconductor with a larger bandgap than the first semiconductor gate layer, and
a gate electrode that is formed on the second semiconductor gate layer and is in Schottky junction with the second semiconductor gate layer, and
wherein the second nitride semiconductor layer is constituted of an AlGaN layer, the first semiconductor gate layer is constituted of a p type GaN layer, the second semiconductor gate layer is constituted of an AlGaN layer,
wherein a third nitride semiconductor layer is formed on the second nitride semiconductor layer,
wherein the gate portion is formed on the third nitride semiconductor layer, and
wherein a removed portion in which a portion of the third nitride semiconductor layer is removed is formed in a region between the gate portion and a drain electrode.

15. The nitride semiconductor device according to claim 14, further comprising:
a dielectric film that covers an exposed surface of the second nitride semiconductor layer and the gate portion; and
a source electrode that is disposed on the dielectric film to cover the gate portion,
wherein, in a region between the gate portion and the drain electrode, the source electrode includes:
a first portion that extends perpendicularly to a surface of the second nitride semiconductor layer along a side of the gate electrode through the dielectric film,
a second portion that extends downward from a lower end of the first portion along a side of the first semiconductor gate layer through the dielectric film, and
a third portion that is continuous with the second portion and extends in a direction parallel to the surface of the second nitride semiconductor layer.

16. A nitride semiconductor device comprising:
a first nitride semiconductor layer that constitutes an electron transit layer;
a second nitride semiconductor layer that is formed on the first nitride semiconductor layer, is larger in bandgap than the first nitride semiconductor layer, and constitutes an electron supply layer; and
a gate portion that is formed on the second nitride semiconductor layer,
wherein the gate portion includes
a first semiconductor gate layer of a ridge shape that is disposed on the second nitride semiconductor layer and is constituted of a nitride semiconductor containing an acceptor type impurity,
a second semiconductor gate layer that is formed on the first semiconductor gate layer and is constituted of a nitride semiconductor with a larger bandgap than the first semiconductor gate layer, and
a gate electrode that is formed on the second semiconductor gate layer and is in Schottky junction with the second semiconductor gate layer, and
wherein the gate electrode contains two or more combinations of TiN that differ in composition ratio.

* * * * *